(12) United States Patent
Groe et al.

(10) Patent No.: US 8,301,086 B2
(45) Date of Patent: Oct. 30, 2012

(54) LOW-POWER POLAR TRANSMITTER

(75) Inventors: John B. Groe, Poway, CA (US);
Michael Noane Farias, San Diego, CA (US)

(73) Assignee: Quintic Holdings, Santa Clara, CA (US)

( * ) Notice: Subject to any disclaimer, the term of this patent is extended or adjusted under 35 U.S.C. 154(b) by 415 days.

(21) Appl. No.: 12/698,154

(22) Filed: Feb. 2, 2010

(65) Prior Publication Data
US 2010/0215120 A1 Aug. 26, 2010

Related U.S. Application Data

(63) Continuation-in-part of application No. 10/265,215, filed on Oct. 4, 2002, now Pat. No. 6,985,703, and a continuation-in-part of application No. 12/351,461, filed on Jan. 9, 2009, now Pat. No. 7,868,691.

(60) Provisional application No. 61/149,250, filed on Feb. 2, 2009, provisional application No. 61/019,967, filed on Jan. 9, 2008.

(51) Int. Cl.
*H04B 1/02* (2006.01)
*H04B 1/04* (2006.01)
*H03C 1/52* (2006.01)
*H01Q 11/12* (2006.01)

(52) U.S. Cl. .... 455/91; 455/108; 455/114.3; 455/127.1; 375/297

(58) Field of Classification Search .............. 455/75–76, 455/91, 108, 114.2–114.3, 118–119, 127.1, 455/127.4; 375/295–300
See application file for complete search history.

(56) References Cited

U.S. PATENT DOCUMENTS

| | | | | |
|---|---|---|---|---|
| 5,502,745 | A * | 3/1996 | Williams et al. | 375/282 |
| 6,091,303 | A * | 7/2000 | Dent | 331/2 |
| 6,650,875 | B1 * | 11/2003 | Rozenblit et al. | 455/91 |
| 6,985,703 | B2 | 1/2006 | Groe et al. | |
| 7,646,238 | B2 * | 1/2010 | Okazaki | 330/149 |
| 7,738,587 | B2 * | 6/2010 | Chen et al. | 375/295 |
| 7,853,212 | B2 * | 12/2010 | van Waasen | 455/42 |
| 7,860,466 | B2 * | 12/2010 | Woo et al. | 455/114.3 |
| 8,195,103 | B2 * | 6/2012 | Waheed et al. | 455/114.3 |
| 2007/0248184 | A1 * | 10/2007 | Plevridis | 375/296 |
| 2007/0287393 | A1 * | 12/2007 | Nandipaku et al. | 455/127.1 |
| 2009/0004981 | A1 * | 1/2009 | Eliezer et al. | 455/127.1 |
| 2009/0054013 | A1 * | 2/2009 | Seo et al. | 455/101 |
| 2009/0067541 | A1 * | 3/2009 | Byun et al. | 375/297 |

* cited by examiner

*Primary Examiner* — Simon Nguyen
(74) *Attorney, Agent, or Firm* — Blairtech Solution LLC

(57) ABSTRACT

Apparatus and methods for providing transmit signals in polar transmitters are described. A modulation signal may be provided from a VCO to low noise and low power signal paths and selectively combined based on a desired output power level. CMOS and CML divider circuits may be used to implement the low noise and low power signal paths respectively, and logic may be provided to select desired signals from the low noise and low power signal stages based on the desired output power level.

26 Claims, 10 Drawing Sheets

LOW-POWER POLAR TRANSMITTER

RELATED APPLICATIONS

The present invention is related and claims priority to U.S. Provisional Patent Application Ser. No. 61/149,250 entitled "Low-Power Polar Transmitter" and filed on Feb. 2, 2009. The U.S. Provisional Patent Application is hereby incorporated by reference in its entireties. This application is also related to U.S. Utility Pat. No. 6,985,703, entitled DIRECT SYNTHESIS TRANSMITTER, issued on Apr. 1, 2005, and to U.S. Utility patent application Ser. No. 12/351,461, entitled COMMUTATING AMPLIFIER WITH WIDE DYNAMIC RANGE, filed on Jan. 9, 2009, which claims priority to U.S. Provisional Patent Application Ser. No. 61/019,967, entitled COMMUTATING AMPLIFIER WITH WIDE DYNAMIC RANGE, filed on Jan. 9, 2008. The contents of each of these patents/applications is hereby incorporated by reference herein in its entirety for all purposes.

FIELD OF THE INVENTION

The present invention relates generally to radio transmitters. More particularly but not exclusively, the present invention is directed towards an efficient and highly linear transmitter architecture to perform direct synthesis of a modulated signal.

BACKGROUND

A transmitter 100 generates radio signals required for communications. It consists of a data source, modulator 110, power amplifier (PA) 120 and antenna 130, as shown in FIG. 1. The modulator 110 varies the amplitude, phase, and/or frequency of a carrier signal depending on the communication method selected.

FIG. 2 shows a detailed diagram of a standard radio transmitter architecture 200. The transmitter comprises a digital modem 210, a pair of digital-to-analog (D/A) converters 220, a phase-locked loop circuit 240, an oscillator 250, a frequency divider 260, a pair of mixer 230, a driver 270, a SAW filter 280 and an amplifier 120. It uses two quadrature mixers 230—known as an I/Q modulator—to generate the modulated signal at the radio frequency. A SAW filter 280 usually follows the I/Q modulator to limit broadband noise and spurs. This architecture operates with reasonable performance. It also allows for reduced current consumption at low to moderate output power levels where requirements are less stringent. These relaxed requirements are illustrated for a WCDMA modulator in FIG. 3.

A polar transmitter 400 uses the approach shown in FIG. 4 to form the modulated signal, where the system comprises a digital modem 410, a variable gain amplifier (VGA) 420 and PA 120. This modulator better suppresses wideband noise—making it possible to eliminate the SAW filter. This is a key benefit. Another benefit is its lower current consumption at high output power levels. Unfortunately, its current consumption cannot be easily reduced to take advantage of relaxed requirements at low to moderate output power levels. It would therefore be advantageous to provide a radio architecture that can operate more efficiently at low to moderate output power levels.

SUMMARY

One or more embodiments of the present invention may provide a very efficient and highly linear transmitter that can be used to directly synthesize and transmit any type of modulated signal.

In one aspect the present invention is directed to an apparatus for use in a polar transmitter comprising a signal combiner circuit, a low noise circuit coupled to a VCO circuit and a signal combiner circuit, said low noise circuit configured to provide a low noise signal provided by a low noise signal path from the VCO to the signal combiner circuit, and a low power circuit coupled to the VCO and the signal combiner circuit, said low power circuit configured to provide a low power signal provided by a low power signal path from the VCO to the signal combiner circuit; wherein the signal combiner circuit is configured to selectively generate an output signal based on the low noise signal, the low power signal, or a combination of the low noise and low power signal.

In another aspect, the present invention is directed to an apparatus for direct synthesis of a modulation waveform in a polar transmitter, comprising a fractional-N phase-locked loop circuit including a counter in the feedback loop controlled by a $\Delta\Sigma$ modulator, wherein a sequence output produced by the $\Delta\Sigma$ modulator alternates between integer values to resolve a fractional N value, a two-port voltage-controlled oscillator, wherein a first port of the oscillator is configured to receive a control voltage for the phase-locked loop and a second port of the oscillator is configured to receive a direct modulation signal, a second input circuit of the fractional-N phase-locked loop configured to remove the modulation applied at the voltage-controlled oscillator, a low-noise circuit providing a low-noise signal path comprising a CMOS divider and variable gain amplifier with two or more shunt stages, a low-power circuit providing a low-power signal path comprising a CML divider and variable gain amplifier with a single low power stage, and a phase selection network configured to align the low-noise and low-power paths.

In another aspect, the present invention is directed to an apparatus for combining two signals paths in a transmitter, comprising a low noise circuit providing a low noise signal path configured for low noise operation, said low noise circuit comprising a divider and a plurality of shunt stages comprising a variable gain amplifier, a low power circuit providing a low power signal path configured for low power operation, said low power circuit comprising a divider and one or more shunt stages of a variable gain amplifier, and a phase selection network configured for selecting the phase of a signal provided in either the low noise circuit or the low power circuit, wherein the phase of a signal is selected based on a closest phase match to a signal provided in the other circuit.

In another aspect, the present invention is directed to a phase selection network for use in a polar modulator, comprising a first multiplexer configured to receive a plurality of phase signals from a first divider circuit, a second multiplexer configured to receive a plurality of phase signals from a second divider circuit, an exclusive-or circuit coupled at a first input to an output of said first multiplexer and coupled at a second input to a output of said second multiplexer, an integrator coupled to an output of the exclusive-or circuit, an analog-to-digital converter coupled to an output of the integrator, and a logic circuit configured to select one of said plurality of phase signals provided to said first multiplexer based on a closest phase offset match to one of said plurality of phase signals provided to said second multiplexer.

In another aspect, the present invention is directed to a method for providing an output signal in a polar modulator transmitter comprising receiving a VCO output signal, dividing, in a low noise signal circuit, the VCO output signal to generate a low noise signal, dividing, in a low power signal circuit, the VCO output signal to generate a low power signal and selectively combining the low noise signal and low power signal in a combiner circuit to generate an output signal for transmission by said transmitter.

In another aspect, the present invention is directed to a polar modulation transmitter comprising a power amplifier circuit, a phase locked loop circuit including a voltage controlled oscillator (VCO), a signal combiner circuit, a low noise circuit coupled to a VCO circuit and a signal combiner circuit, said low noise circuit configured to provide a low noise signal provided by a low noise signal path from the VCO to the signal combiner circuit, and a low power circuit coupled to the VCO and the signal combiner circuit, said low power circuit configured to provide a low power signal provided by a low power signal path from the VCO to the signal combiner circuit; wherein the signal combiner circuit is configured to selectively generate an output signal provided to the power amplifier, said output signal being based on the low noise signal, the low power signal, or a combination of the low noise and low power signal responsive to a desired output level.

Additional aspects of the present invention are further described below in conjunction with the accompanying Drawings.

BRIEF DESCRIPTION OF THE DRAWINGS

The following is a brief description of the drawings wherein.

DETAILED DESCRIPTION

Figure 5:
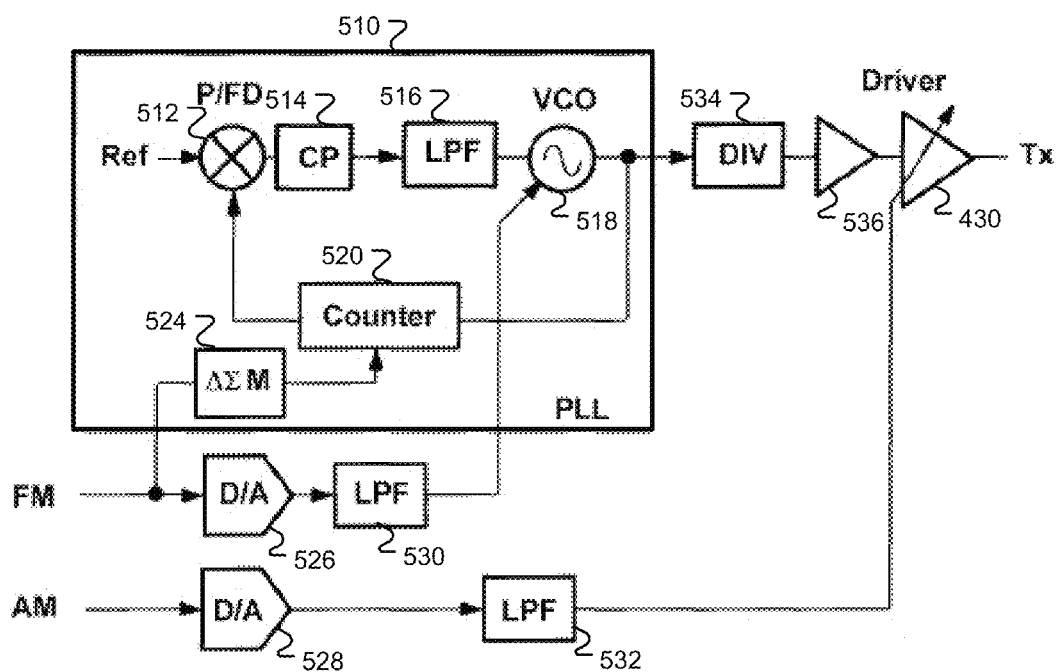
FIG. 5 shows a block diagram of a polar transmitter in accordance with aspects of the present invention.

A polar transmitter efficiently modulates the RF carrier signal. It may employ a modified fractional-N phase-locked loop (PLL) 510 to apply the phase/frequency modulation 512 and a variable-gain driver amplifier 430 to control the envelope of the RF signal as shown in FIG. 5.

The modified fractional-N PLL relies on a multi-port voltage-controlled oscillator (VCO) 518 to allow direct, wideband phase/frequency modulation. Applying the modulation signal simultaneously to the $\Delta\Sigma$ modulator 524 (and counter 520) removes the modulation in the PLL feedback path. This allows the PLL to synthesize the RF carrier at the appropriate frequency. The input signal is represented in the polar coordinate as amplitude (AM) and phase (FM). The amplitude part is processed by a D/A 528 and a Low Pass Filter (LPF) 532. The processed AM is then used to adjust the gain of the variable gain amplifier 430. The FM part of the signal has two routes to the polar transmitter: in one route, the FM signal is processed by the $\Delta\Sigma$ modulator 524; and in the other route, the FM signal is processed by a D/A 526 and a LPF 530, and then feeds to the VCO 518. In the PLL 510, a reference signal and the output from the counter 520 are fed to the Phase/Frequency Detector (P/FD) 512. The output from the P/FD 512 is processed by the Charge Pump (CP) 514 followed by a LPF 516. The filtered signal is used to adjust the frequency of the VCO 518. The VCO output may be processed by a frequency divider 534 and buffered by a buffer 536 before the frequency divided signal is provided to the variable gain amplifier 430.

Figure 6:
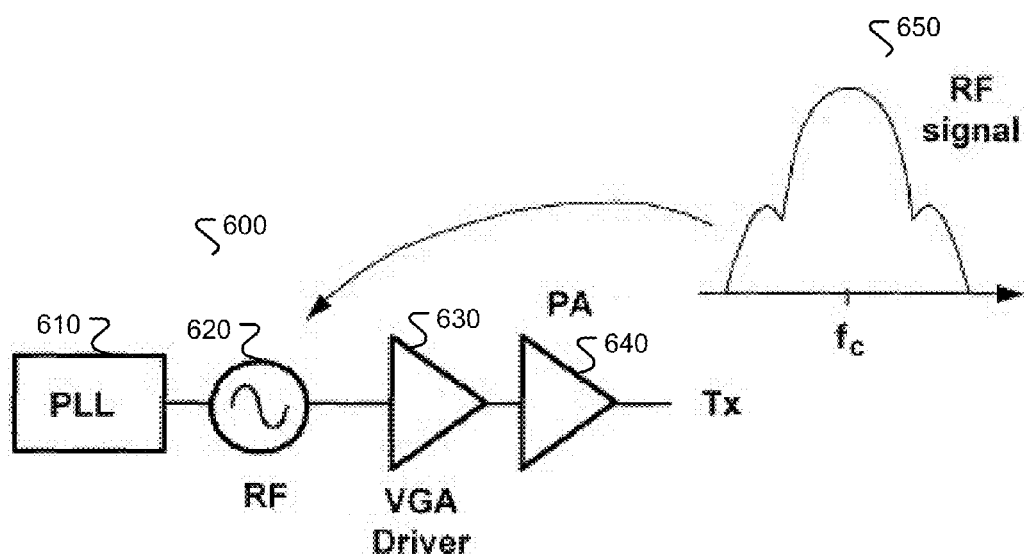
FIG. 6 depicts the problem of injection pushing in a radio transmitter.

In some embodiments, the VCO output may be connected to a divide-by-2/4 circuit that shifts the output off-frequency. This may provide advantages because the high-power PA potentially couples energy back to the VCO and forces it to track the modulated output with disastrous results. This phenomenon is know as injection pushing and is illustrated in FIG. 6, where the system comprises a VCO 620, and a VGA driver 630 and a PA 640 to amplify the VCO output. A PLL 610 is used to adjust the frequency of the VCO. The spectrum of the RF signal 650 illustrates the energy concentration at the carrier frequency fc, which is the VCO output frequency. The divide-by-2/4 circuit also allows a single VCO to support a very wide range of RF carrier frequencies. When a frequency divider is used, the transmitter output frequency will be much lower than the VCO output frequency. Therefore, any energy coupled back to the VCO 620 will not affect the performance of the VCO.

Figure 1:
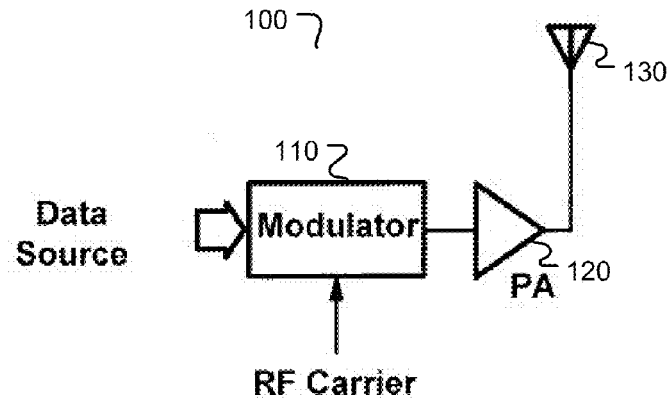
FIG. 1 shows a block diagram of a typical radio transmitter.
Figure 2:
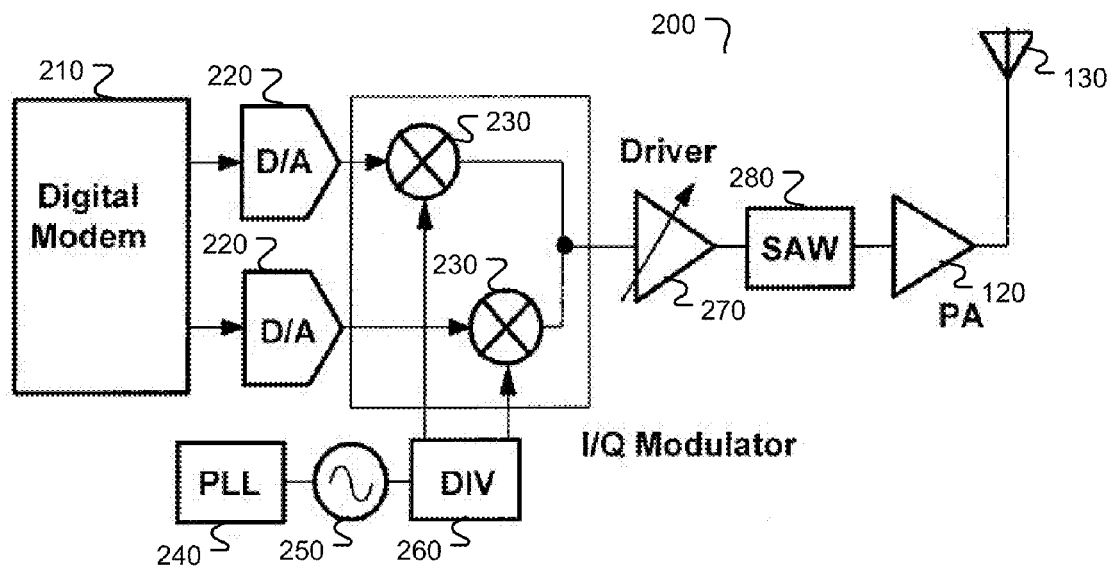
FIG. 2 shows a block diagram of a direct upconverter transmitter architecture.
Figure 3:
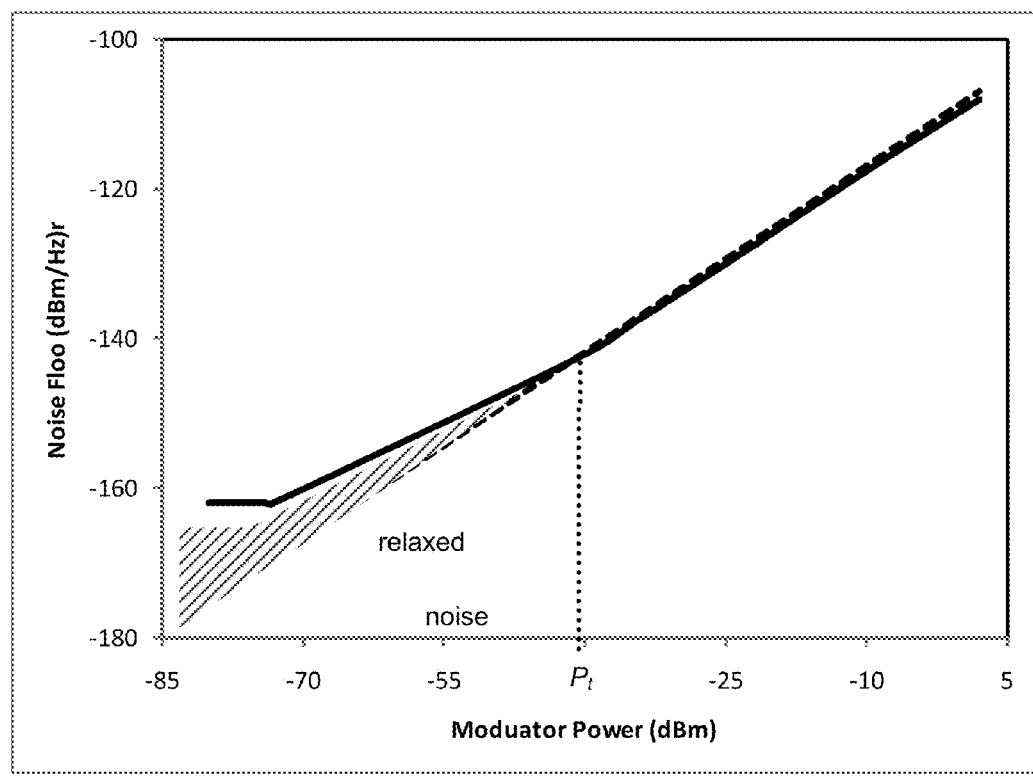
FIG. 3 illustrates relaxed requirements for a WCDMA modulator.
Figure 4:
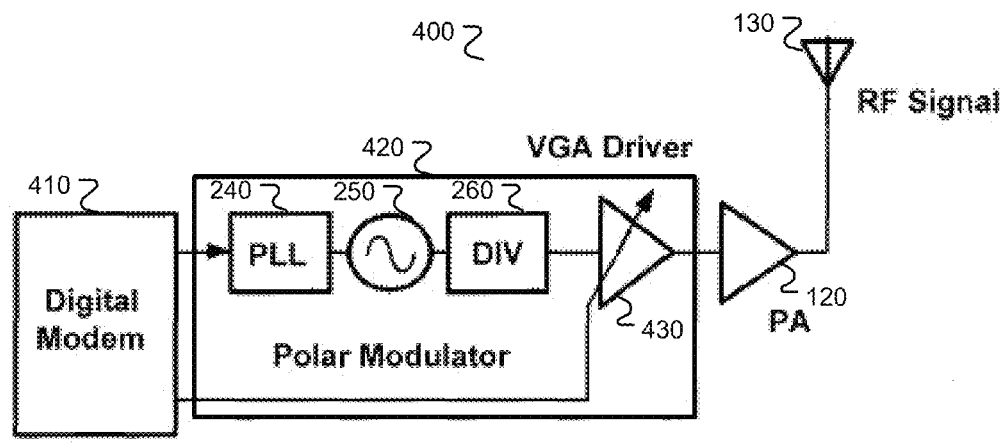
FIG. 4 shows a block diagram of a polar transmitter architecture in accordance with aspects of the present invention.

In general, the VCO develops a fairly large signal with low noise level and an excellent signal-to-noise ratio. This is critical to eliminating the SAW filter that precedes the PA, such as is shown in FIG. 2. That's because the SAW filter attenuates spurious signals and noise—especially noise in the receive radio band. Moreover, the PA amplifies any noise present.

The divide-by-2/4 circuit that follows the VCO invariably elevates the noise floor of the transmitter. As such, it's critical that the divider signal levels remain high to minimize any added noise. This is only possible with circuits such as CMOS that have signals that swing between supply levels.

Figure 7A:
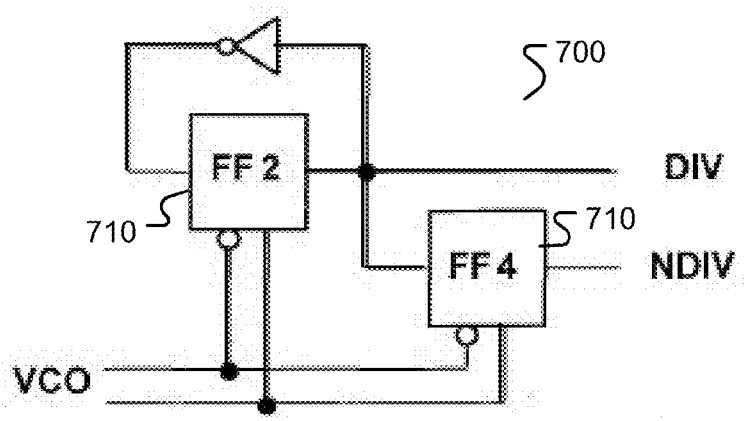
FIG. 7(a) illustrates one embodiment of a pseudo-differential divide-by-2 circuit in CMOS technology in accordance with aspects of the present invention.
Figure 7B:
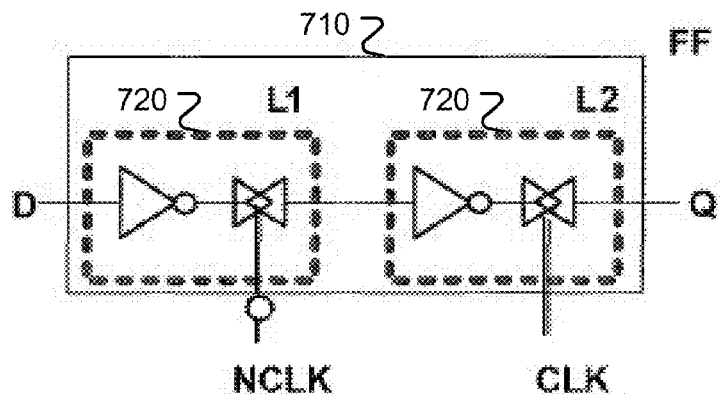
FIG. 7(b) illustrates one embodiment of a flip flop comprising two latches as may be used in the circuit shown in FIG. 7(a)

FIG. 7a describes an embodiment of a pseudo-differential divide-by-2 circuit 700 in CMOS technology. It uses two flips-flops 710 to generate a pair of complimentary output signals. Each flip-flop 710 may consist of two latches 720 and 722 as shown in the embodiment of FIG. 7b. A latch transfers its data input to its output when the associated clock signal becomes active. This results in the latch delaying the data input signal one-half clock cycle. It follows then that a flip-flop (comprised of two latches) then delays the data input signal one full clock cycle. Using an inverter to connect the flip-flop output to its input forces the flip-flop's output to toggle each full clock cycle and realizes the divide-by-2 function.

Figure 7C:
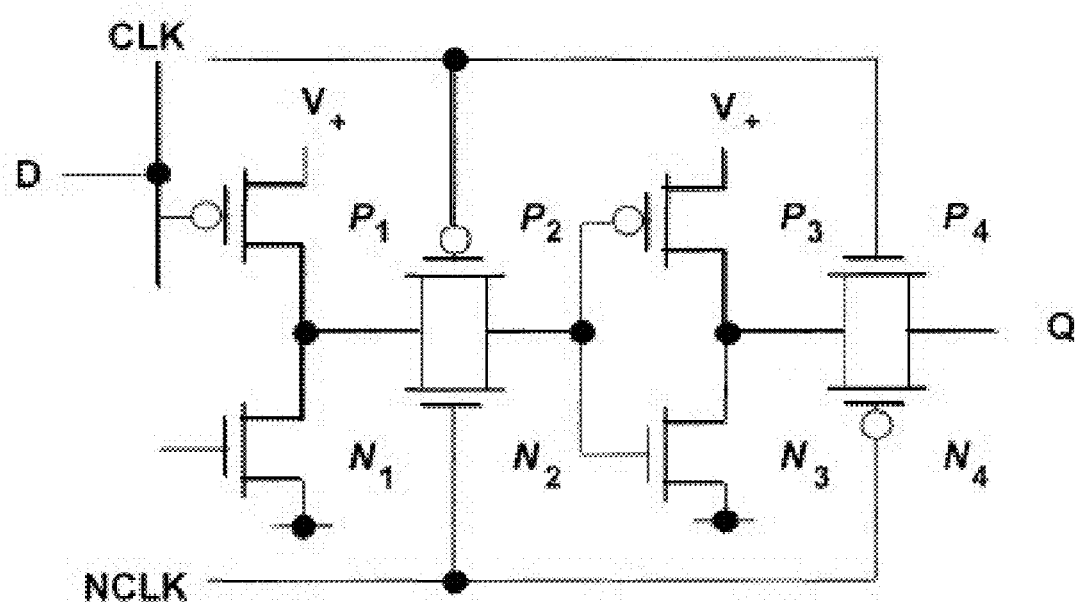
FIG. 7(c) illustrates one embodiment of a CMOS flip-flop circuit in accordance with aspects of the present invention.

Details of an embodiment of a CMOS flip-flop are shown in FIG. 7c. Transistors $P_1$-$N_1$ form an inverter while transistors $P_2$-$N_2$ create a transmission gate. (This transmission gate passes the input signal to its output with NCLK active; otherwise, it isolates it from the output). Together these devices implement latch $L_1$ 720. Similarly, the transistors $P_3$-$N_3$, and $P_4$-$N_4$ implement latch $L_2$ 722. The internal signals switch between $V_+$ and ground to realize an output with a high signal-to-noise ratio. Note that the transistors must be sized fairly large (W/L ratio) to switch as quickly as possible. In practice, the CMOS divider consumes at least 10 mA (if not more) to achieve the required performance.

Figure 7D:
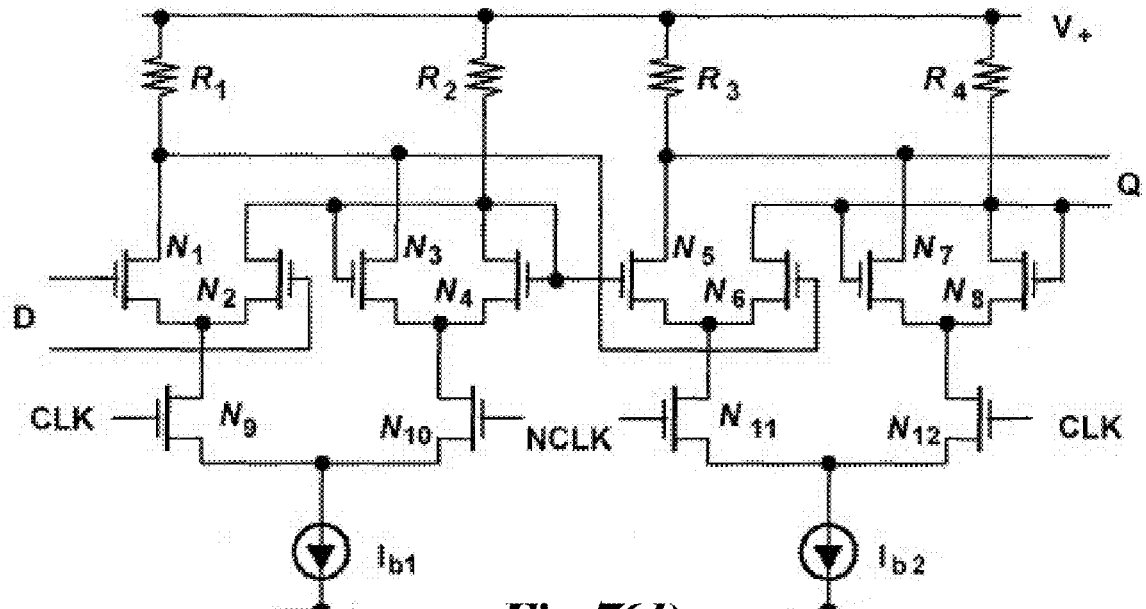
FIG. 7(d) illustrates one embodiment of a CML flip-flop in accordance with aspects of the present invention.

In contrast, FIG. 7d shows the details of an embodiment of a current mode logic (CML) flip-flop. Each latch consists of six transistors (($N_1$-$N_4$ and $N_9$-$N_{10}$) or ($N_5$-$N_8$ and $N_{11}$-$N_{12}$)), current source $I_{b1}$ or $I_{b2}$, and load resistors $R_1$-$R_2$ or $R_3$-$R_4$. (It's also possible to realize the load resistors in some embodiments with MOS devices). With the clock signal active, latch $L_1$ routes the bias current $I_{b1}$ through transistors $N_1$-$N_2$ which amplify the data input signal. When the clock signal switches, transistors $N_3$-$N_4$ activate and their positive feedback connection latches the output signal. Latch $L_2$ functions in a similar way as latch $L_1$. The signal swing and current consumption of the CML latch (and flip-flop) can be very low—1 mA or less in some cases. Unfortunately, the CML implementation cannot achieve the same performance as the CMOS divider.

Figure 7E:
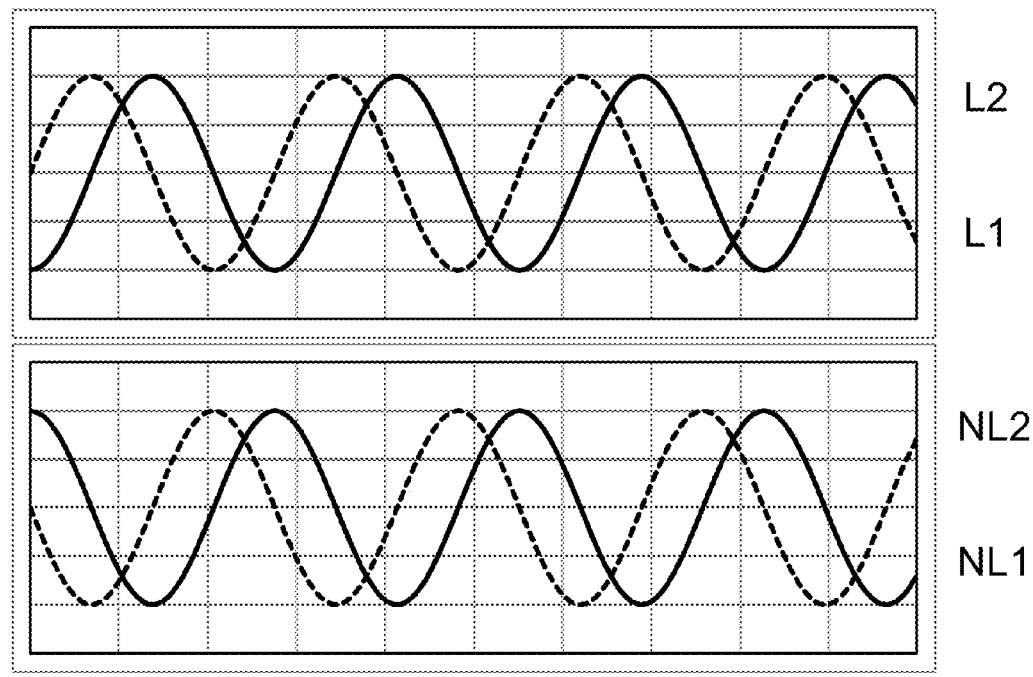
FIG. 7(e) illustrates CMOS and CML outputs as may be generated by the circuits shown in FIGS. 7(a)-7(d)

Both the pseudo-differential CMOS divider and the CML divider potentially provide four output signals separated in phase by $\pi/2$. This characteristic is depicted in FIG. 7(e) and is important to implementations of the low power polar transmitter.

The RF signal produced by the VCO and divide-by-2/4 circuit includes phase/frequency modulation. As such, its amplitude remains constant and unimportant until modulated by a variable-gain driver amplifier. Ideally, the variable gain amplifier (VGA) provides amplification at low noise levels, adds little distortion, and consumes very little power. This is important because any distortion produced by the transmitter spills power into adjacent communication channels and thereby reduces system capacity. To minimize distortion, the bias current in the VGA and other circuits is typically high—an unwanted attribute for portable devices.

Figure 8:
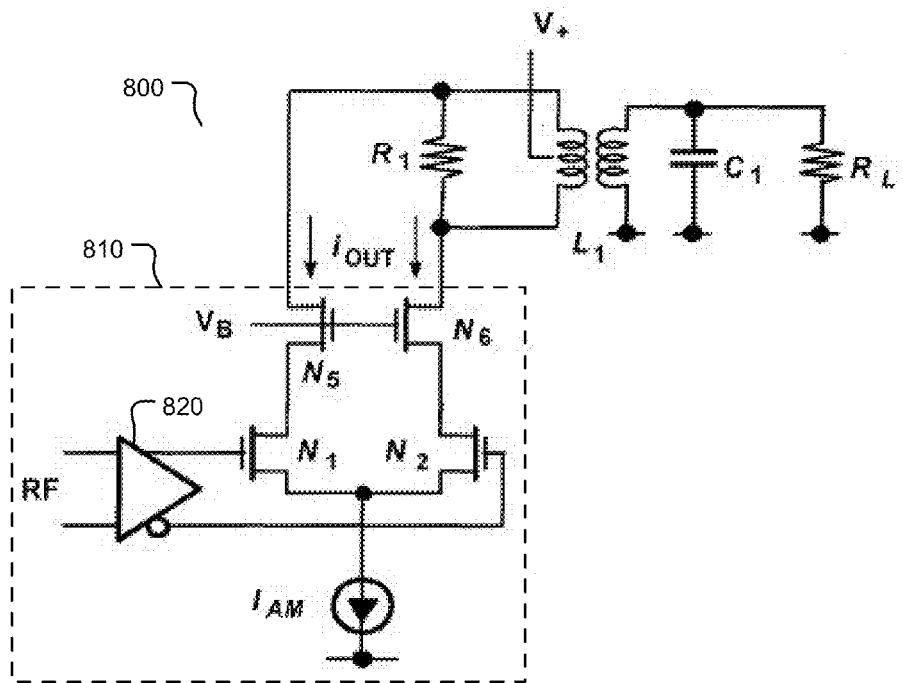
FIG. 8 shows an embodiment of a commutating buffer in accordance with aspects of the present invention.

FIG. 8 illustrates an embodiment of a commutating variable-gain driver amplifier 800. The RF signal produced by the divide-by-2/4 circuit switches or communicates the AM signal supplied by current source $I_{AM}$. The resulting output current $I_{OUT}$ flows to the load and the differential-to-single ended balun. Cascade transistors $N_5$-$N_6$ isolate the load from the current-steering switches $N_1$-$N_2$. The section of the commutating variable-gain driver amplifier 800 comprising cascade transistors $N_5$-$N_6$, the current-steering switches $N_1$-$N_2$, the buffer 820, and the current source is designated as circuit block 810.

To operate efficiently, the RF carrier signal must quickly and fully switch the commutating devices $N_1$-$N_2$. This requires a voltage swing approximately equal to $$V_{Sw} \geq \sqrt{\frac{\max(i_{AM}(t))}{K}}$$

where $\max(i_{AM})$ is the peak value of signal and K is the intrinsic gain of the MOS devices in the switching core. (In practice, the parameter K varies inversely with oxide thickness $t_{ox}$).

The driver communicates the signal current $I_{AM}$ to produce a square-wave output. The output balun and associated matching network attenuates any signal harmonics except the fundamental and intended transmit signal. Note that the efficiency of the commutating amplifier tracks the level of signal $i_{AM}(t)$.

The signal $i_{AM}(t)$ represents the amplitude or envelope variation of the complex transmit signal. In many applications it also includes information related to the transmit signal's power level. This is because the amplitude and power level can be conveniently combined as follows $$i_{AM}(t) \rightarrow p_{Tx} \times i_{AM}(t)$$

where $p_{Tx}$ signifies the designated power control level.

The RF carrier signal must remain fairly large even when the adjusted current $i_{AM}(t)$ drops to low levels (corresponding to low output power levels). At the same time, the devices must be sized fairly large to handle the operating current at full output power. Consequently, these devices typically possess large capacitances that form a parasitic leakage path for the RF carrier signal to the RF output.

Figure 9:
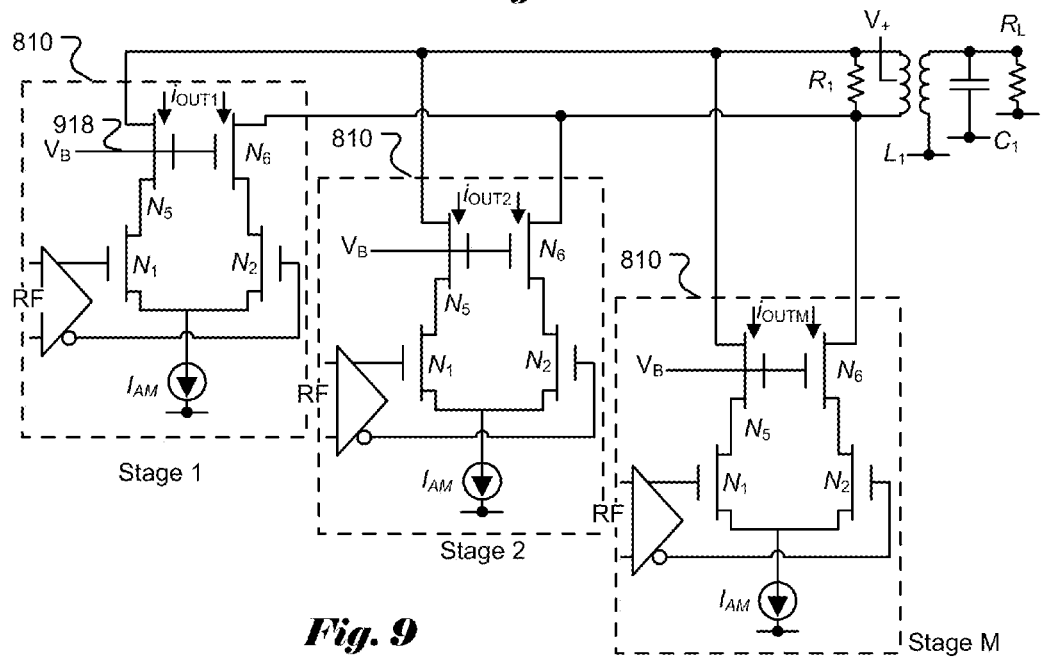
FIG. 9 shows an embodiment of a commutating buffer with M stages III accordance with aspects of the present invention.

Many wireless systems demand wide control of the transmit output power level. This requires a driver with wide dynamic range. To achieve this, the driver structure may be split into two or more stages (denoted as stages 1 through M) as illustrated in the embodiment of FIG. 9, where each stage contains a circuit block 820. This approach reduces the coupling path at low power levels by disabling unused stages.

Figure 10:
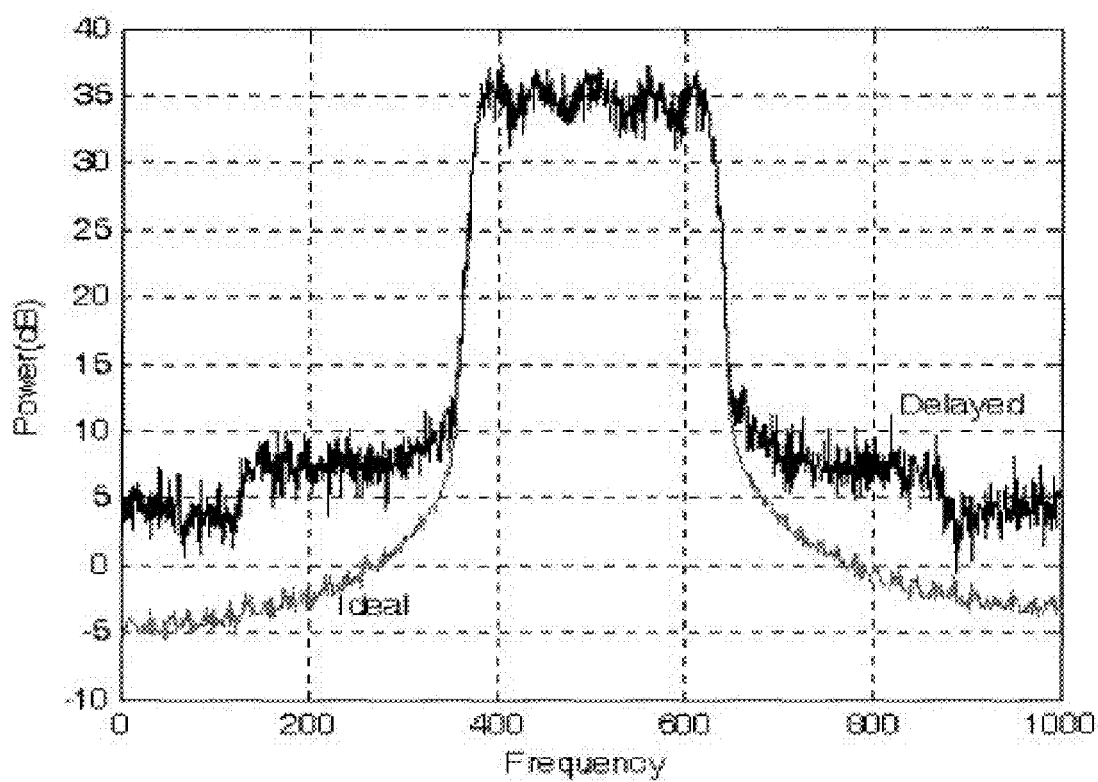
FIG. 10 illustrates the effects of amplitude/phase time alignment error on the transmit spectrum.

The driver modulates the amplitude or envelope of the phase/frequency-modulated RF carrier. It effectively combines the modulation signals, which must be properly aligned to avoid distortion and spectral regrowth as shown in FIG. 10. An alignment error or timing offset as small as 50 nSec can be disastrous. Fortunately, these signals can be aligned using digital methods.

Figure 11:
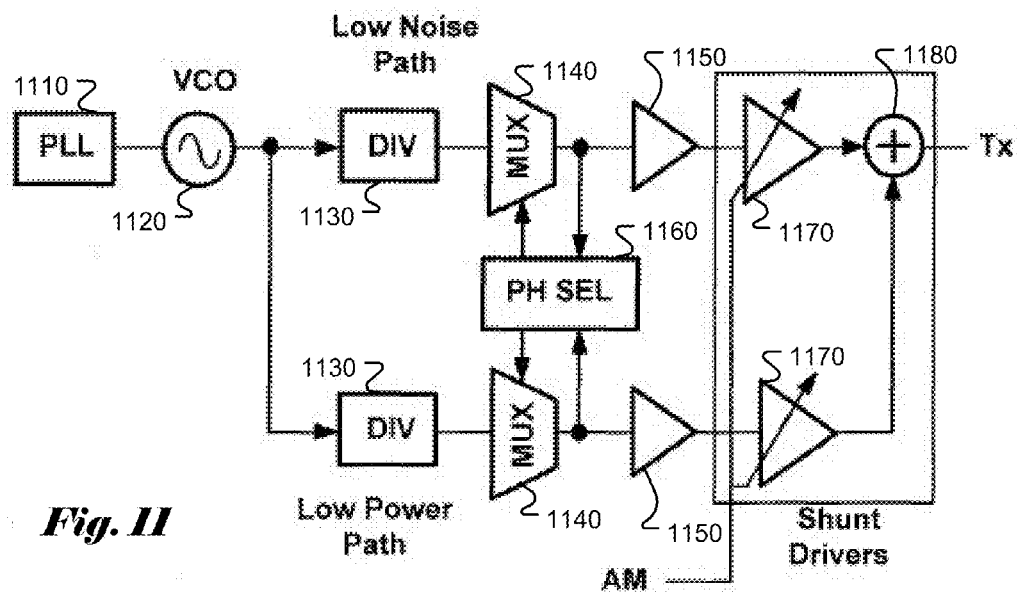
FIG. 11 shows a diagram of an embodiment of a dual-path polar transmitter in accordance with aspects of the present invention.

An embodiment of a low power polar transmitter in accordance with aspects of the present invention combines both a low-noise path and a low-power path as shown in FIG. 11. The low noise path and low power path are combined at a combiner circuit that includes M stages. The low-noise path uses CMOS designs for the divider 1130, MUX 1140, and buffer amplifiers 1150 that connect to the shunt driver 1170 and combiner 1180, typically at M−1 stages. Phase selector 1160 is used to control the multiplexers 1140 to select one of the input phases. The low-power path incorporates CML designs to lower the signal swing and current consumption. The input signal to the dividers is generated from a VCO 1120 with frequency control by a PLL 1110. It is typically configured to feed a single stage (stage M) of the shunt driver/combiner due to its low output power requirements. However, other configurations may be used in some embodiments. The shunt driver/combiner combines output currents from both paths at its output, typically to a load and differential-to-single ended balun.

In practice, the output currents combine nearly identical signals with unknown phase offsets. As such, it's even possible for the signals to combine destructively. To avoid this potential problem, typical embodiments of the inventive low power polar transmitter include a phase alignment network. This network selects the divider phase that most closely aligns with the opposite path. Recall that each divider produces four output signals separated by $\pi/2$. It follows then that the phase difference between the two paths can be at most $\pi/4$.

Figure 12:
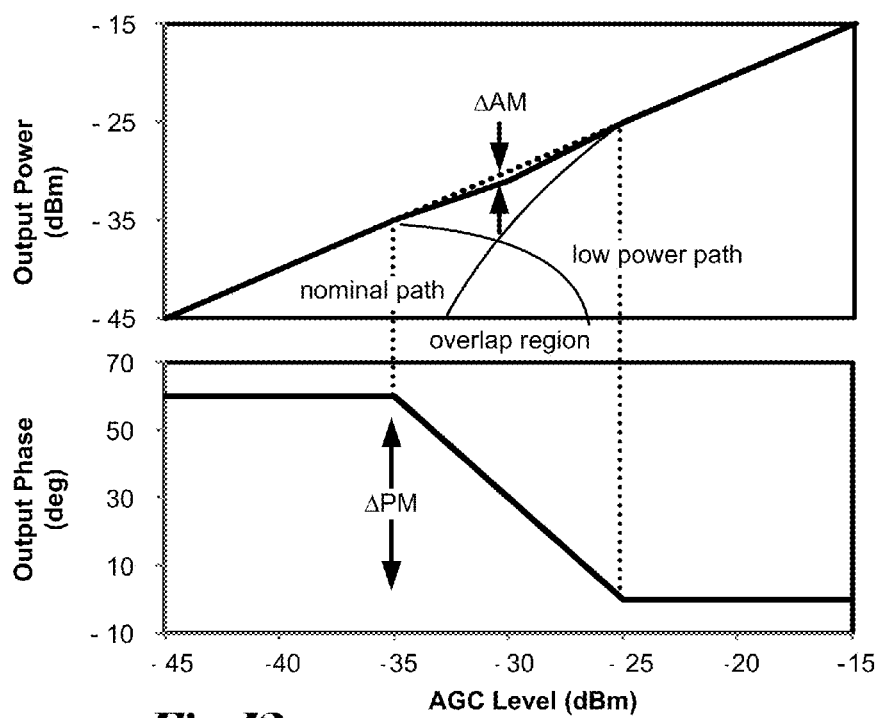
FIG. 12 illustrates the transition between the two paths of the dual-path polar transmitter.

A power control network may be used to steer the AM signal between the two paths. The low-power path may be configured to be turned off at high output levels to suppress noise while the low-noise path may be configured to turn off at low output levels to reduce current consumption. In various embodiments these turn on and turn off levels may be determined by a dynamic threshold level or a predefined threshold level. Moreover, both paths may be configured to operate in an intermediate or transition output level region that minimizes any amplitude or phase steps due to the unavoidable phase differences (up to $\pm\pi/4$) between the two paths. Details of an embodiment of this concept are illustrated in FIG. 12. In typical embodiments this functionality is implemented in the phase-selection network section, however, it may alternately be implemented in the combiner section and/or in a dedicated section or in other sections of the apparatus (not shown).

Figure 13A:
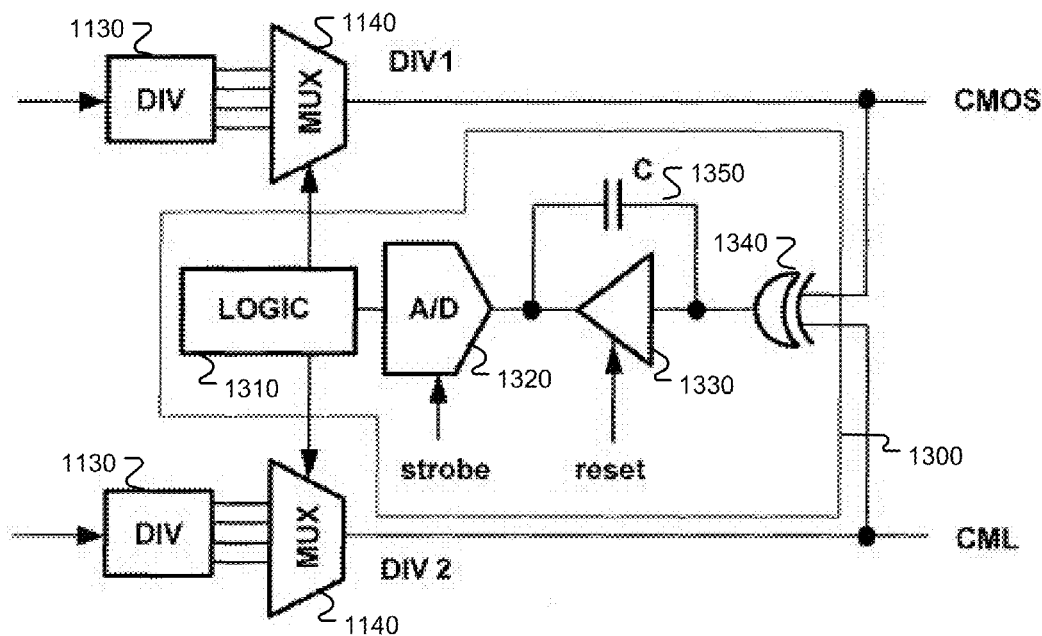
FIG. 13(a) shows details of an embodiment of a phase select network in the dual-path polar transmitter in accordance with aspects of the present invention.
Figure 13B:
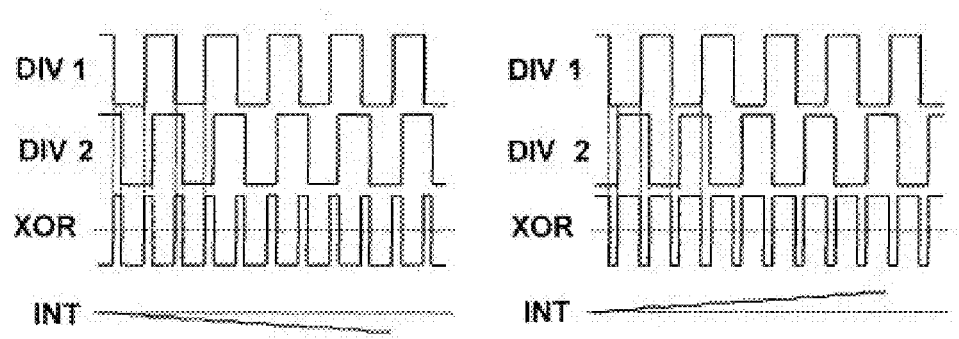
FIG. 13(b) illustrates signals in the network shown in FIG. 13(a).

Details of an embodiment of the phase select network 1300 are shown in FIG. 13(*a*). Each multiplexer 1140 selects one of the four divider 1130 outputs. The signals, DIV1 and DIV2, feed an exclusive-or gate 1340 that acts as a phase detector. Its output in turn drives an integrator 1330 with a capacitor 1350 that tracks the phase difference between DIV1 and DIV2. The integrator's output is converted to a digital signal by the analog-to-digital (A/D) 1320. Logic 1310 is used to provide control signals to the multiplexers 1140 based on the digital signal from the A/D 1320. The integrator's output trends towards zero when the phase offset between these signals approach $\pi/4$ as shown in FIG. 13(*b*).

Outside the transition region, only one path operates. As the output power adjusts towards the transition region, the phase select network searches for the divider signal that best matches the phase of the divider signal used by the opposite and active path. This requires all four divider outputs to be tested. The A/D converter stores the result of each test. Each result is then compared to find the closest to zero. (Note that the inverter is reset for each test and the A/D converter is strobed a set time after the reset is deactivated to capture the result). The integrator reduces wideband noise and improves the resolution of the system.

In one or more embodiments, the inventive low power polar transmitter provides both low-noise performance and low-power consumption by incorporating a novel dual path approach. This may result in an optimized architecture for a wide range of output power levels. It may also improve dynamic range by reducing internal signal levels at the lower output power levels.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated.

What is claimed is:

1. Apparatus for use in a polar transmitter comprising:
a signal combiner circuit;
a low noise circuit coupled to a VCO circuit and a signal combiner circuit, said low noise circuit configured to provide a low noise signal provided by a low noise signal path from the VCO to the signal combiner circuit; and
a low power circuit coupled to the VCO and the signal combiner circuit, said low power circuit configured to provide a low power signal provided by a low power signal path from the VCO to the signal combiner circuit;
wherein the signal combiner circuit is configured to selectively generate an output signal based on the low noise signal, the low power signal, or a combination of the low noise and low power signal.

2. The apparatus of claim 1 wherein:
said low noise circuit includes a low noise divider circuit configured to divide the VCO output signal to generate one or more low noise divided signals, wherein said low noise signal is selected from said one or more low noise divided signals; and
said low power circuit includes a low power divider circuit configured to divide the VCO output signal to generate one or more low power divided signals, wherein said low power signal is selected from said one or more low power signals.

3. The apparatus of claim 2 wherein:
said low, noise divider circuit is configured to generate a first low noise divided signal having a first phase and a second low noise divided signal having a second phase;
said low power divider circuit is configured to generate a first low power divided signal having a first phase and a second low power signal having a second phase; and
a phase alignment network configured to:
determine a closest phase relationship between said low noise divided signals and said low power divided signals; and
select one of said first and said second low noise divided signals and one of said first and said second low power divided signals responsive to said determining a closest phase relationship.

4. The apparatus of claim 1 further comprising a power control network configured to:
selectively couple the low noise signal to the combiner and selectively decouple the low power signal from the combiner at high desired output levels;
selectively couple the low power signal to the combiner and selectively decouple the low noise signal from the combiner at low desired output levels; and
selectively couple both the low noise signal and the low power signal to the combiner at intermediate desired output levels.

5. The apparatus of claim 1 wherein the polar transmitter is configured without a SAW filter in the output stages.

6. The apparatus of claim 1 wherein said low noise circuit comprises a CMOS divider circuit.

7. The apparatus of claim 6 wherein said CMOS divider circuit comprises a pseudo-differential divide-by-2 circuit.

8. The apparatus of claim 7 wherein said pseudo-differential divide-by-2 circuit comprises a pair of flip-flops configured to generate a corresponding pair of complementary output signals; wherein the output of a first flip-flop of said pair of flip-flops is coupled to the input through an inverter.

9. The apparatus of claim 8 wherein each of said pair of flip-flops comprises a pair of latches.

10. The apparatus of claim 1 wherein said low power circuit comprises a CML divider circuit.

11. The apparatus of claim 10 wherein said CML divider circuit comprises a pseudo-differential divide-by-2 circuit.

12. The apparatus of claim 11 wherein said pseudo-differential divide-by-2 circuit comprises a pair of flip-flops configured to generate a corresponding pair of complementary output signals; wherein the output of a first flip-flop of said pair of flip-flops is coupled to the input through an inverter.

13. The apparatus of claim 12 wherein each of said pair of flip-flops comprises a pair of latches.

14. The apparatus of claim 1 wherein said signal combiner circuit comprises one or more commutating variable-gain driver amplifier stages configured to commutate an AM signal provided to said Apparatus.

15. The apparatus of claim 1 wherein said signal combiner circuit comprises a driver structure comprising a plurality of driver stages configured to be selectively switched on or off in response to a desired power level.

16. The apparatus of claim 15 wherein a first of said plurality of driver stages is coupled to the low noise circuit and a second of said plurality of driver stages is coupled to the low power circuit.

17. The apparatus of claim 16 further comprising a plurality of driver stages coupled to the low noise circuit and a single driver stage coupled to the low power circuit.

18. A method for providing an output signal in a polar modulator transmitter comprising:
receiving a VCO output signal;
dividing, in a low noise signal circuit, the VCO output signal to generate a low noise signal;
dividing, in a low power signal circuit, the VCO output signal to generate a low power signal; and
selectively combining the low noise signal and low power signal in a combiner circuit to generate an output signal for transmission by said transmitter.

19. The method of claim 18 wherein the selectively combining comprises selecting one of the low noise signal, the low power signal, or a combination of the low noise signal and low power signal to generate the output signal.

20. The method of claim 18 further comprising:
generating, in the low noise circuit, a first low noise divided signal having a first phase and a second low noise divided signal having a second phase;
generating, in the low power circuit, a first low power divided signal having a first phase and a second low power signal having a second phase;
determining, in a phase alignment network, a closest phase relationship between said low noise divided signals and said low power divided signals; and
selecting, responsive to said determining a closest phase relationship, one of said first and said second low noise divided signals as said low noise signal and one of said first and said second low power divided signals as said low power signal.

21. The method of claim 18 further comprising:
selectively generating the output signal in the combiner based on only the low noise signal at high desired output levels;
selectively generating the output signal in the combiner based on only the low power signal at low desired output levels; and
selectively generating the output signal in the combiner based on both the low noise signal and the low power signal at intermediate desired output levels.

22. The method of claim 18 wherein said low noise signal circuit comprises a CMOS divider circuit.

23. The method of claim 18 wherein said low power signal circuit comprises a CML divider circuit.

24. The method of claim 18 wherein said low noise signal is provided to a plurality of low power driver stages, and further comprising selectively enabling or disabling ones of said plurality of low power driver stages responsive to a desired output level.

25. The method of claim 24 wherein said low power signal is provided to a single low power driver stage and further comprising selectively disabling said single low power driver when a desired output level exceeds a predetermined threshold level.

26. A polar modulation transmitter comprising:
a power amplifier circuit;
a phase locked loop circuit including a voltage controlled oscillator (VCO);
a signal combiner circuit;
a low noise circuit coupled to a VCO circuit and a signal combiner circuit, said low noise circuit configured to provide a low noise signal provided by a low noise signal path from the VCO to the signal combiner circuit; and
a low power circuit coupled to the VCO and the signal combiner circuit, said low power circuit configured to provide a low power signal provided by a low power signal path from the VCO to the signal combiner circuit;
wherein the signal combiner circuit is configured to selectively generate an output signal provided to the power amplifier, said output signal being based on the low noise signal, the low power signal, or a combination of the low noise and low power signal responsive to a desired output level.

* * * * *